(12) United States Patent
Helal et al.

(10) Patent No.: US 7,289,561 B2
(45) Date of Patent: Oct. 30, 2007

(54) METHOD AND DEVICE FOR CONTROLLING A PULSE GENERATOR FOR THE EMISSION OF PULSE SIGNAL OF ULTRA WIDEBAND POSITION-MODULATED TYPE

(75) Inventors: Didier Helal, St. Julien en Genevois (FR); Fritz Lebowsky, Palo Alto, CA (US)

(73) Assignees: STMicroelectronics N.V., Amsterdam (NL); STMicroelectronics SA, Montrouge (FR)

( * ) Notice: Subject to any disclaimer, the term of this patent is extended or adjusted under 35 U.S.C. 154(b) by 845 days.

(21) Appl. No.: 10/465,532

(22) Filed: Jun. 19, 2003

(65) Prior Publication Data

US 2004/0047414 A1    Mar. 11, 2004

(51) Int. Cl.
*H03K 7/04*    (2006.01)
(52) U.S. Cl. .................................... 375/239
(58) Field of Classification Search ............ 375/239, 375/354, 355, 357, 359, 362, 363, 364, 365, 375/366, 368, 371, 372, 373, 376, 377, 130, 375/140; 369/59.12, 59.11, 59.1; 370/205, 370/204, 203, 213; 377/27, 43
See application file for complete search history.

(56) References Cited

U.S. PATENT DOCUMENTS 4,330,752 A * 5/1982 Rauskolb ..................... 327/3

7,054,349 B2 * 5/2006 Cattaneo et al. ............ 375/130

FOREIGN PATENT DOCUMENTS

| EP | 0 315 377 | 10/1988 |
| EP | 0 752 778 | 1/1997 |
| JP | 08-056240 | 2/1996 |

* cited by examiner

*Primary Examiner*—Pankaj Kumar
(74) *Attorney, Agent, or Firm*—Lisa K. Jorgenson; Allen, Dyer, Doppelt, Milbrath & Gilchrist, P.A.

(57) ABSTRACT

Pulses of a signal, which are respectively contained in successive time windows, may be generated by a generator, and a control device may formulate a control signal for the generator including, for each pulse, an indication of its position in the corresponding window. The control device may include a processor to deliver for each time window, at a delivery frequency Fe greater than the pulse repetition frequency, successive groups of N bits together defining a digital cue of position of a pulse inside the window. Also, a converter may convert this digital position cue into the control signal temporally spread over the length (T) of the window and including the indication of position at an instant corresponding to the digital position cue. This makes it possible to position the pulse inside its window with a temporal precision equal to 1/N*Fe.

33 Claims, 7 Drawing Sheets

METHOD AND DEVICE FOR CONTROLLING A PULSE GENERATOR FOR THE EMISSION OF PULSE SIGNAL OF ULTRA WIDEBAND POSITION-MODULATED TYPE

FIELD OF THE INVENTION

The invention relates to radio technology of the ultra wideband (UWB) type, and more particularly, to the control of a pulse generator for the emission of an incident pulse signal of the ultra wideband type conveying encoded digital information, e.g. in a wireless local area network.

BACKGROUND OF THE INVENTION

Ultra wideband-type technology is distinguished from narrowband and spread spectrum technologies in the sense that the bandwidth of the signal of ultra wideband type is typically between about 25% and about 100% of the central frequency. Moreover, instead of transmitting a continuous carrier modulated with information or with information combined with a spreading code, which determines the bandwidth of the signal, ultra wideband technology involves the transmission of a series of very narrow pulses. For example, these pulses may take the form of a single cycle, or monocycle, having a pulse width of less than 1 ns. These pulses that are extremely short in the time domain, when transformed into the frequency domain produce the ultra wideband spectrum that is characteristic of UWB technology.

In UWS technology, the information transmitted by the signal can be encoded, for example, by a modulation technique called "pulse position modulation" (PPM). In other words, the information encoding is carried out by varying the instant of transmission of individual pulses. More specifically, the pulse train is transmitted at a frequency of repetition that can be as much as several tens of MHz. Each pulse is transmitted in a window of predetermined length, for example, 50 na. Compared to a theoretical position of transmission, the pulse is then ahead or delayed, enabling a "0" or a "1" to be encoded. More than two values can also be encoded by using more than two positions shifted relative to the reference position. It is also possible to superimpose a BPSK modulation on this position modulation.

In view of the central frequency of the pulses, which is generally of the order of a few GHz, and the positional shift of the pulses with respect to the theoretical position, which is for example of the order of a few tens of picoseconds, it then becomes necessary to use clock signals having very high frequencies, for example of the order of about 100 GHz. Now, this necessitates the use of means which are constraining both from the technological point of view and from the point of view of the consumption of current. Thus, conventionally, this has not been implemented in CMOS technology.

Moreover, it is important that the precision of the clock also be very good, typically of a few picoseconds, thereby adding further technological constraints.

SUMMARY OF THE INVENTION

An object of the invention is to provide a means or device for controlling the pulse generator which can be embodied as CMOS technology in a particularly simple manner, while offering precision compatible with the positional modulation required.

The invention therefore provides a method for controlling a pulse generator for the emission of a pulse signal of the ultra wideband position-modulated type, in which, the pulses of the pulse signal being intended to be contained in time windows, a control signal is formulated for the generator containing for each pulse an indication of its position in the corresponding window.

According to a general characteristic of the invention, successive groups of N bits together defining a digital cue of position of a pulse inside the window are delivered for each time window, at a delivery frequency Fe greater than the pulse repetition frequency, and this digital position cue is converted into the control signal temporally spread over the length of the window and comprising the indication of cosition at an instant corresponding to the digital position cue. This makes it possible to position the pulse inside its window with a temporal precision equal to $1/N*Fe$. Thus, the invention in fact uses a kind of parallel/series conversion starting from groups of N bits in parallel so as to end up with a temporally spread control signal containing at a given instant the indication of position of the pulse in the window.

Also, by using this parallel/series conversion it is possible to work with a clock signal at the frequency Fe, for example a few hundred MHz, and to obtain temporal precision of at least 100 picoseconds, for example of the order of 50 picoseconds, this corresponding to an effective clock signal of 20 GHz. In practice, N may be an integer power of 2, for example 7. Moreover, although not indispensable, the delivery frequency Fe is advantageously equal to a multiple of the pulse repetition frequency.

According to one embodiment, providing for the emission of several pulses temporally shifted inside one and the same time window, the successive groups of N bits together define the digital cues of position of the pulses inside the window, and these digital position cues are converted into the control signal temporally spread over the length of the window and comprising the indications of position, at the instants corresponding to the digital position cues.

According to an embodiment of the invention, for each time window just one of the groups of N bits comprises a bit having a first logic value, for example 1, all the other bits of this group and those of the other groups having a second logic value, for example a value logic 0. The bit having the first logic value therefore defines, for example, the initial instant of the pulse.

According to an embodiment of the invention, the conversion of the digital position cue comprises: the formulation, from a base clock signal having the frequency Fe, of N elementary clock signals all having the same frequency Fe but mutually temporally shifted by $1/N*Fe$; the control by the N elementary clock signals of N flip-flops successively receiving the groups of N bits; and the summation of the N outputs of the N flip-flops.

The invention is also directed to a device for generating a pulse signal of the ultra wideband position-modulated type, comprising a controllable pulse generator able to generate the pulses of the pulse signal which are contained in time windows, and control means/device able to formulate a control signal for the generator containing for each pulses an indication of its position in the corresponding window. According to a general characteristic of the invention, the control means/device comprises processing means able to deliver for each time window, at a delivery frequency Fe greater than the pulse repetition frequency, successive groups of N bits together defining a digital cue of position of a pulse inside the said window, and conversion means able to convert this digital position cue into the control signal temporally spread over the length of the window and comprising the indication of position at an instant corresponding to the digital position cue, thereby making it possible to position the pulse inside its window with a temporal precision equal to 1/N*Fe.

According to one embodiment of the invention, the conversion means comprise a programmable clock circuit receiving a base clock signal having the frequency Fe and delivering N elementary clock signals all having the same frequency Fe but mutually temporally shifted by 1/N*Fe, N flip-flops connected at input to the output of the processing means and respectively controlled by the N elementary clock signals, and respectively delivering N output signals, and a summator with N inputs respectively connected to the outputs of the N flip-flops and delivering the said control signal.

The programmable clock circuit preferably comprises a digital phase-locked loop comprising a programmable ring oscillator delivering the N elementary clock signals and controlled from a control circuit receiving the respective outputs of N flip-flops all receiving the base clock signal and respectively controlled by the N elementary clock signals. The use of a digital phase-locked loop in combination with parallel/series conversion means makes it possible to obtain a precision better than a few tens of picoseconds for the mutual phase shifts (mutual time shift) of the N elementary clock signals.

The conversion means, in particular the digital phase-locked loop, are advantageously embodied as CMOS technology, thereby making it possible in particular to be able to place the conversion means in a standby mode for predetermined time intervals. As stated otherwise, the system can easily be switched on/off, thereby allowing considerable savings of energy.

The invention is also directed to a terminal of a wireless transmission system, for example of the local network type, incorporating the device as defined hereinabove.

BRIEF DESCRIPTION OF THE DRAWINGS

Other advantages and characteristics of the invention will become apparent on examining the detailed description of embodiments and the appended drawings, in which.

DETAILED DESCRIPTION OF THE PREFERRED EMBODIMENTS

Figure 1:
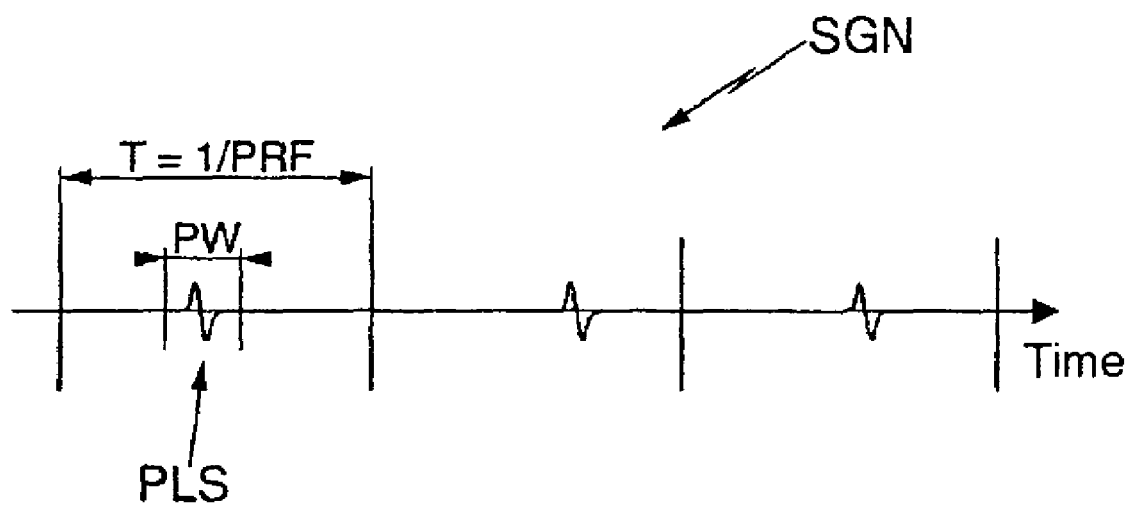
FIG. 1 diagrammatically illustrates a signal of the ultra wideband type.
Figure 2:
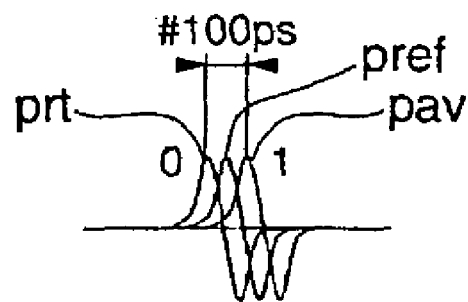
FIG. 2 diagrammatically illustrates in greater detail an encoding of a bit by a modulation of the pulse position (PPM modulation) type.

In FIG. 1, the reference SGN designates an initial pulse signal of the ultra wideband type including pulses PLS of known theoretical shape. More specifically, these pulses PLS have a predetermined time-domain width PW, for example typically less than 1 ns, for example of the order of 360 picoseconds. The successive pulses PLS are each contained in successive time windows of length T equal to the inverse of the pulse repetition frequency (PRF). As a guide, the length T of each time window is, for example, equal to 50 ns. The position of each pulse in a time window can vary from one window to another according to a pseudo-random code. Moreover, when the signal transports information encoded with a position modulation (PPM), the pulse can, as illustrated in FIG. 2, be slightly ahead (pav) or slightly delayed (prt) relative to the reference position (pref) of the pulse in the window, depending on the value "0" or "1" of the information transmitted. The pulses PLS have characteristics of an ultra wideband type pulse, in the sense that the ratio of the bandwidth of the pulse at half-power to the central frequency is greater than ¼. As a guide, the central frequency of a pulse may be several GHz.

Figure 3:
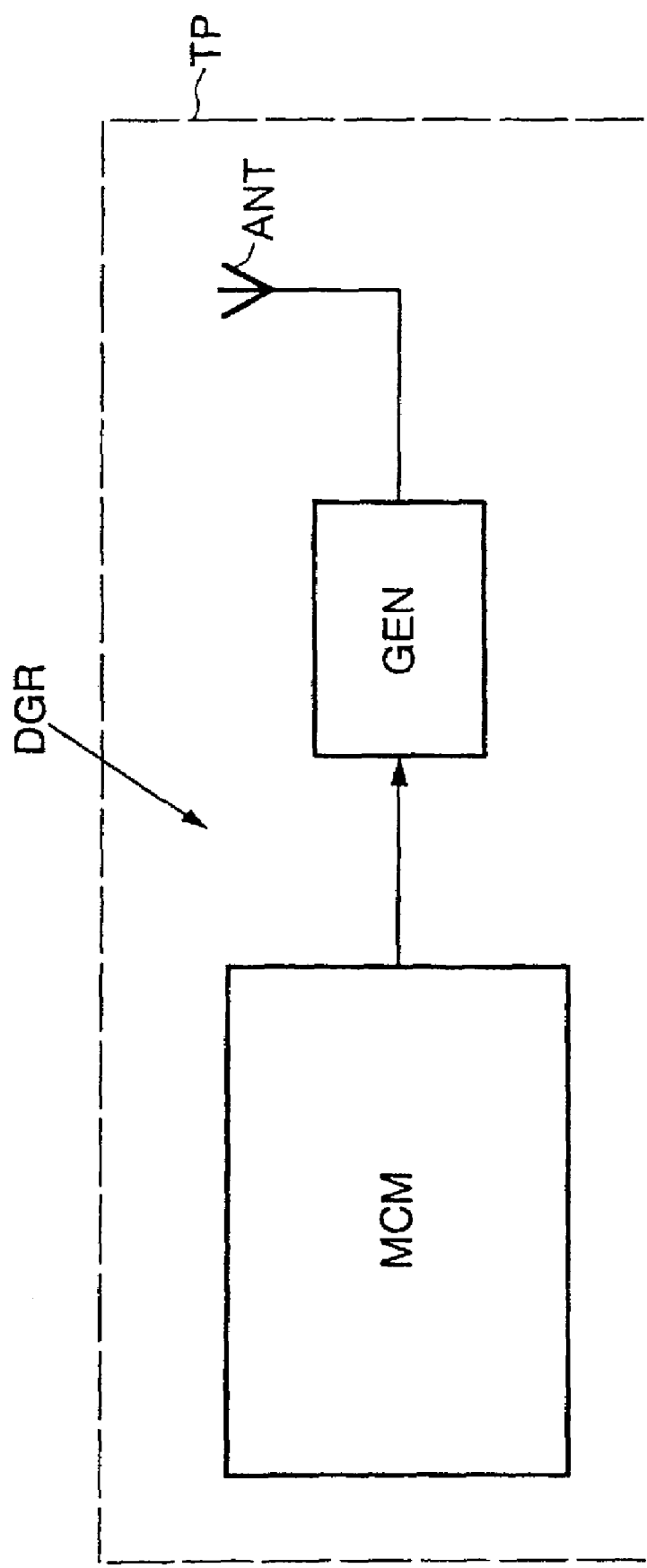
FIG. 3 diagrammatically illustrates an embodiment of a device according to the invention.

The generating device DGR according to the invention, an embodiment of which is illustrated in FIG. 3 and which is advantageously incorporated into a terminal TP of a local wireless communication network, will make it possible to generate the successive pulses of the pulse signal SGN which are intended to be contained respectively in the successive time windows of length T. This device DGR comprises a pulse generator GEN, of conventional structure known per se, whose function is to generate the pulse from the moment at which it receives the order therefor from a control signal emitted by control means/device MCM. The pulse is then transmitted to the antenna ANT so as to be emitted towards UWB signal receivers, of conventional and known structures.

Figure 4:
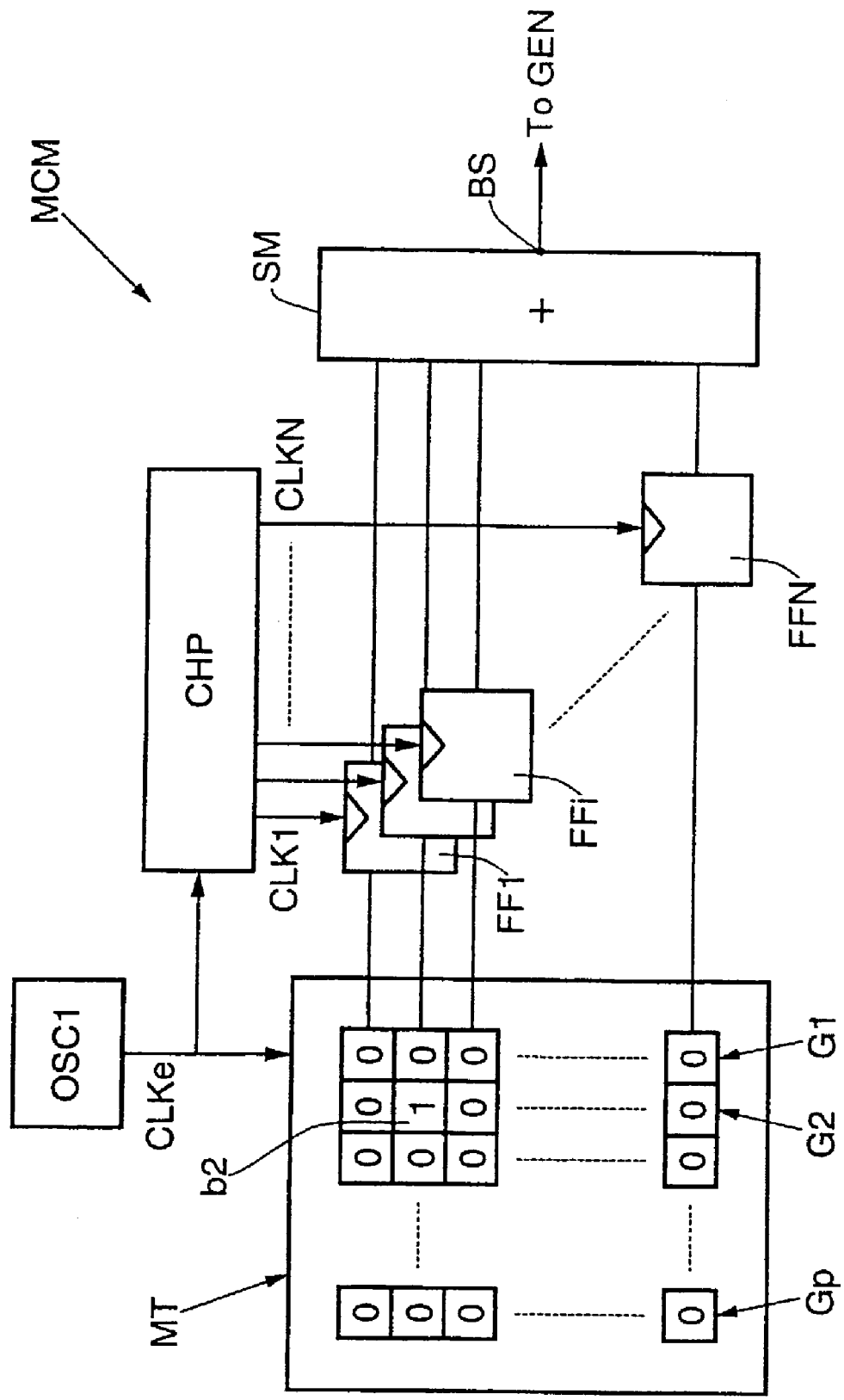
FIG. 4 diagrammatically illustrates in greater detail an embodiment of the means/device for controlling a device according to the invention.

Referring now to FIG. 4, it may be seen that the control means/device comprises a processor/processing means MT, able to deliver for each time window of length T, and at a delivery frequency Fe equal in this example to a multiple of the pulse repetition frequency PRF, successive groups G1-Gp of N bits together defining a digital cue of position of the pulse inside the window. We shall return to this matter in greater detail below. In the particular case illustrated in FIG. 4, the period T (length of the windows) is equal to P times the period Te of the clock signal CLKe having the delivery frequency Fe and provided for example by a quartz oscillator OSC1. In terms of the hardware, the processing means MT can comprise a memory comprising the set of bits, as well as a processor associated with an output register, so as to successively deliver at the tempo of the clock signal CLKe the successive groups Gi of N bits.

In addition to the processing means MT, the control means/device MCM comprises "parallel/series" converter/conversion means comprising a programmable clock circuit CHP receiving the base clock signal CLKe and delivering N elementary clock signals CLKl-CLKN, all having the same frequency Fe, but mutually temporally shifted by 1/N*Fe. By way of indication, these clock signals may be mutually temporally shifted, by of the order of 50 picoseconds, for example. The conversion means also comprise N D-type flip-flops, respectively referenced FF1-FFN. These flip-flops are respectively controlled by the N elementary clock signals and they receive as input the N bits of each of the successive groups Gi.

In tempo with the successive rising edges of the various elementary clock signals CLK1 and CLKN, the N bits of each group will be successively delivered at the output of the flip-flops FFi in the form of 0- or 5-volt signals for example (these values depending on the technology used), as a function of the value of the bits, and summed in a summator SM. After p rising edges of the base clock signal CLKe, the p groups will have been processed and the entire digital position cue will have been processed and converted after summation SM into a control signal temporally spread over the length of the time window and intended to control the pulse generator GEN. The position of the pulse, on this occasion its initial instant, is defined by the logic value 1 of one of the bits of the set of groups of bits, for example bit b2 of group G2, in FIG. 4.

Figure 6:
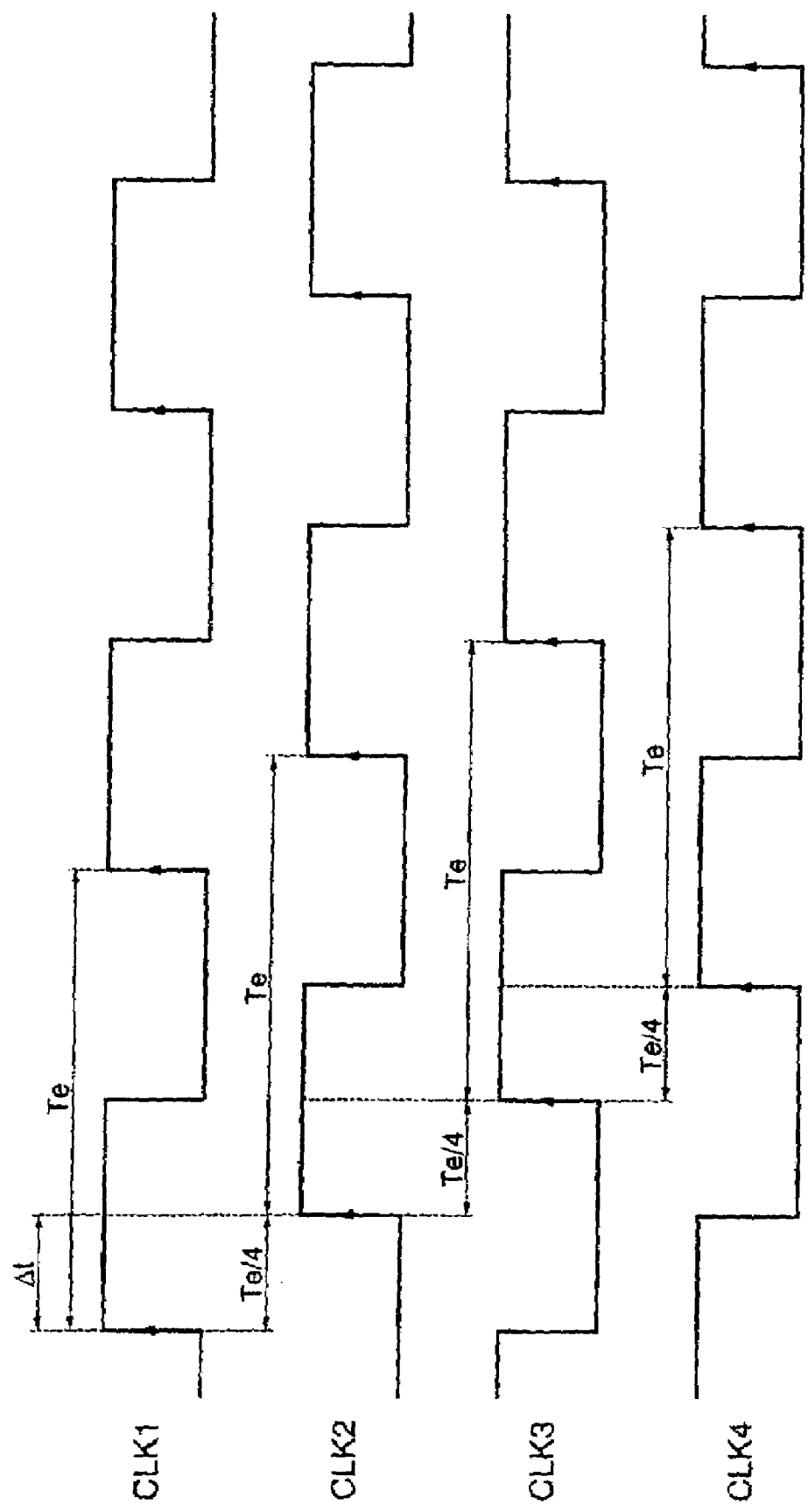
FIG. 6 is a diagrammatic time chart of the various clock signals used in the control means/device.

Consequently, these means make it possible to position the initial instant of the pulse with a temporal precision equal to 1/N*Fe. By way of example, reference may be made to FIG. 6 in which, for the sake of simplification, only four elementary clock signals CLK1-CLK4 (corresponding to N=4) have been represented. In fact, as may be seen in FIG. 6, the base clock signal CLKe is one of the elementary clock signals, for example the signal CLK1.

Figure 5:
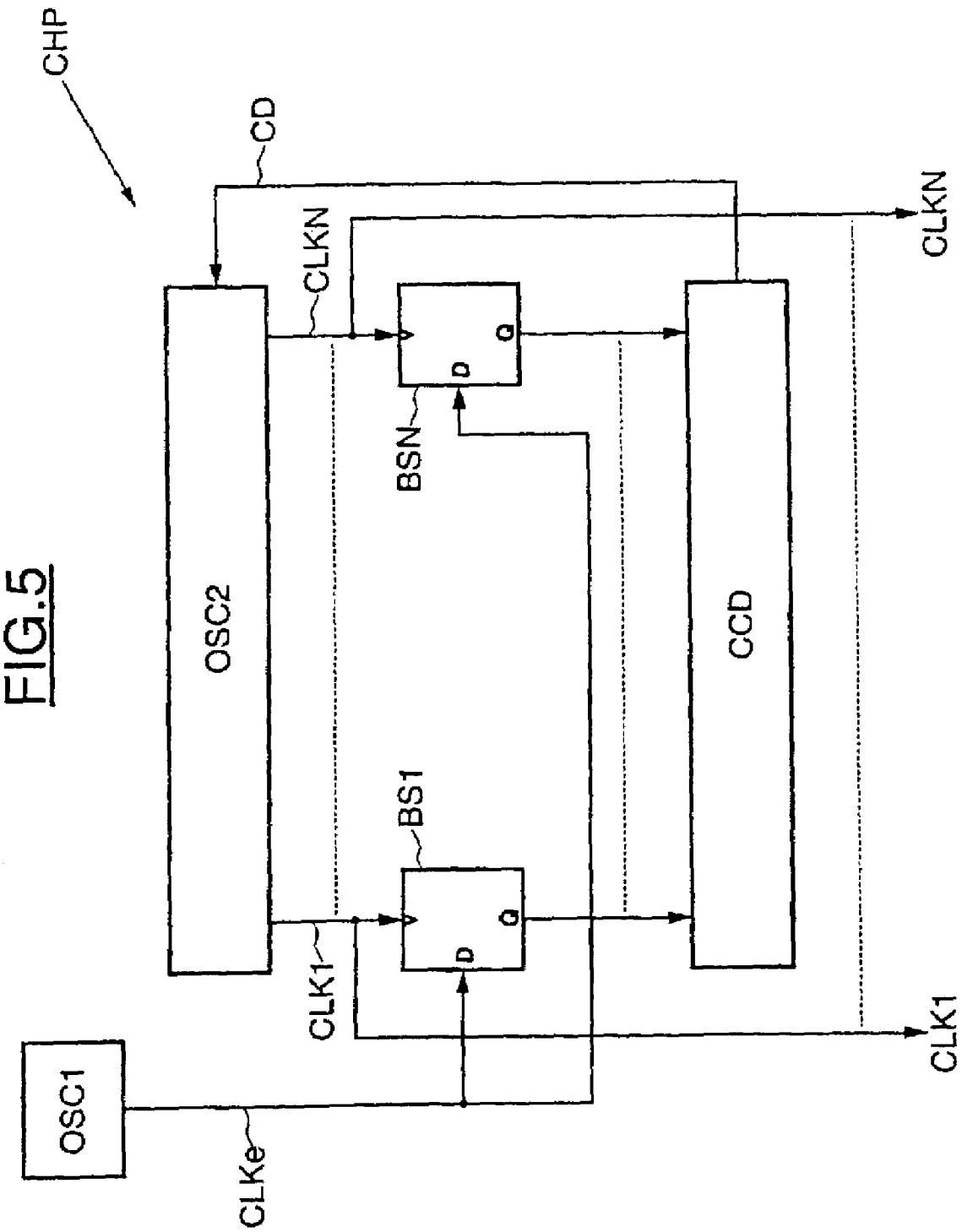
FIG. 5 diagrammatically illustrates in greater detail a part of the control means/device of FIG. 4.

In practice, the programmable clock circuit CHP may include a clock, for example a quartz crystal, and of a certain number of delay elements arranged in series at the output of the clock. In this regard, the person skilled in the art may optionally refer to European Patent Application No. 0 843 481. One of the problems lies in the fact that the elementary clock signals should be delivered with precision (or very low jitter), for example of the order of a few picoseconds. This is the reason why it is therefore advantageous that the programmable clock circuit CHP comprise a digital phase-locked loop including (FIG. 5) for example a programmable ring oscillator OSC2 delivering the N elementary clock signals CLK1-CLKN. This ring oscillator is controlled from a control circuit CCD receiving the respective outputs of N flip-flops BS1-BSN. These N flip-flops are respectively controlled by the N elementary clock signals CLK1-CLKN and receive on their D input the base clock signal CLKe from for example a conventional quartz oscillator OSC1.

In this regard, the person skilled in the art may refer if necessary to U.S. Pat. No. 6,208,182, especially as far as the control of the ring oscillator is concerned. Nevertheless, the general principles thereof will now be reviewed. The control circuit CCD includes means for comparing samples pair-wise, in such a way as to determine whether a state transition has occurred in an interval of time separating the two samples, this comparison being made over at least two cycles, which may or may not be consecutive, of the ring oscillator. This comparison is carried out in such a way that: if during the second cycle a comparable state transition is detected in the same interval, the control of the ring oscillator is not modified; if during the second cycle a comparable state transition is detected in a later interval, the period of the ring oscillator is reduced; and if during the second cycle a comparable state transition is detected in an earlier interval, the period of the ring oscillator is increased.

Figure 7:
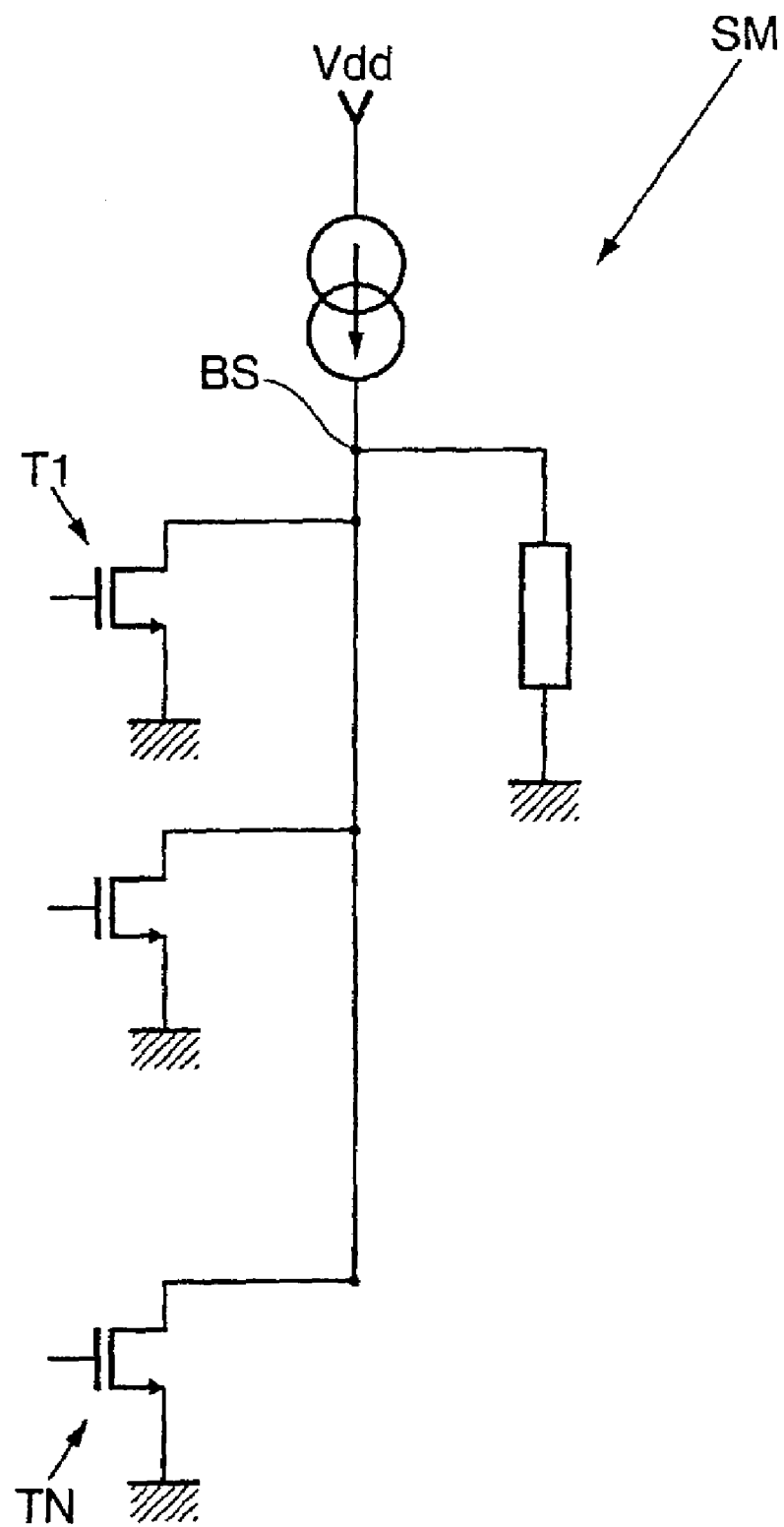
FIG. 7 diagrammatically illustrates in greater detail another part of the control means/device.

As far as the summator SM is concerned, one way of embodying it is illustrated in FIG. 7. More precisely, it may be seen that the summator SM here comprises N NMOS transistors, referenced T1-TN respectively. The base of each transistor is linked to the output of the corresponding flip-flop FF. Moreover, the sources of this transistor are linked to earth and their drain is linked to the supply voltage Vdd. The common drains of these transistors form the output terminal BS. In practice, when all the bits of a group are at 0, the transistors are off. Conversely, when one of these bits, for example the bit b2, goes to 1, the corresponding transistor turns on and the output voltage available at the terminal BS, initially at the value Vdd, is pulled towards ground, causing the pulse generator to trigger.

Figure 8:
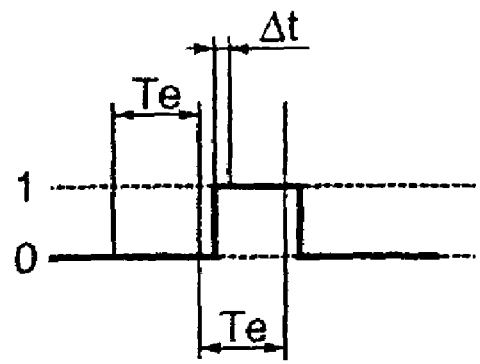
FIGS. 8 and 9 diagrammatically illustrate a mode of operation of a device according to the invention.
Figure 9:
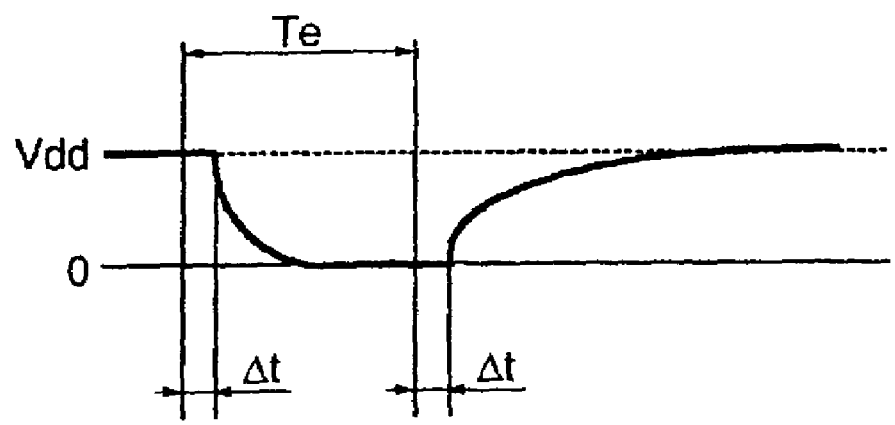

More precisely, this is illustrated in FIGS. 8 and 9. In FIG. 8, it may be seen that the initial instant, defined by bit b2, of the pulse is situated in the course of the second period Te (since bit 2 belongs to the second group G2) and with a delay Δt equal to 1/N*Fe with respect to the start of the period (since the second bit is involved). The signal delivered by the second flip-flop FF2, illustrated in FIG. 8, takes the logic 1 value upon the rising edge of the elementary clock signal CLK2 and keeps it until the next rising edge of this elementary clock signal CLK2, that is to say for a period Te.

Correspondingly, as illustrated in FIG. 9, the signal at the output of the summator keeps the value Vdd up till a later instant Δt after the start of the second period Te, then it decreases down to the value 0, rising again to the value Vdd after a delayed instant Δt after the end of this second period Te. Thus, according to the invention, the control means operate at the delivery frequency Fe (200 MHz for example) and allow the emission of a single pulse per window of length T with a temporal precision of the order of 50 picoseconds. Their clocking at the delivery frequency readily permits embodiment as CMOS technology integrated circuit form.

The invention is not limited to the embodiments and modes of implementation just described but embraces all variants thereof. Thus, it would be possible to emit several pulses temporally shifted inside one and the same time window. In this case, the successive groups of N bits together define the digital cues of position of the pulses inside the window (several bits belonging to different groups may take the value 1 for example), and the conversion means are able to convert these digital position cues into the said control signal temporally spread over the length of the window and comprising the indications of position, at the instants corresponding to the digital position cues.

That which is claimed is:

1. A method for controlling a pulse generator to generate an ultra wideband position-modulated pulse signal, wherein pulses of the pulse signal are contained in time windows, the method comprising:
providing a control signal for the generator, the control signal including, for each pulse, an indication of the pulse position in the corresponding window, and comprising
delivering, for each time window, successive groups of N bite that together define a digital position cue of pulse position inside the window, at a delivery frequency Fe greater than a pulse repetition frequency, and
positioning the pulse inside the window with a temporal precision equal to 1/N*Fe by converting the digital position cue into the control signal temporally spread over a length of the window and comprising the indication of pulse position at an instant corresponding to the digital position cue.

2. The method according to claim 1, wherein the temporal precision is at least 100 picoseconds.

3. The method according to claim 1, wherein N is a power of 2, the delivery frequency is 200 MHz and the temporal precision is 50 picoseconds.

4. The method according to claim 1, wherein the delivery frequency is a multiple of the pulse repetition frequency.

5. The method according to claim 1, wherein for each time window just one group of the successive groups of N bits comprises a bit having a first logic value while all other bits of the one group and other groups have a second logic value, the bit having the first logic value defining an initial instant of the pulse.

6. The method according to claim 1, wherein several temporally shifted pulses are emitted inside a window, the successive groups of N bits together define the digital cues of pulse position inside the window, and the digital position cues are converted into the control signal temporally spread over the length of the window and comprising the indications of position, at the instants corresponding to the digital position cues.

7. The method according to claim 1, wherein the conversion of the digital position cue comprises:
- formulating, from a base clock signal having the frequency Fe, N elementary clock signals all having the same frequency Fe but mutually temporally shifted by 1/N*Fe;
- controlling, with the N elementary clock signals, N flip-flops successively receiving the groups of N bits; and
- summing outputs of the N flip-flops.

8. A method of providing a control signal for controlling a pulse generator to generate an ultra wideband position-modulated pulse signal including pulses within time windows, the method comprising:
- providing, for each time window, groups of bits that together define a position cue of pulse position inside the window, a first group of the groups of bits comprising a bit having a first logic value while other bits of the first group and other groups have a second logic value, the bit having the first logic value defining an initial instant of the pulses; and
- converting the position cue into the control signal temporally spread over a length of the window and comprising an indication of pulse position corresponding to the position cue.

9. The method according to claim 8, wherein several temporally shifted pulses are emitted inside a window, the groups of bits together define the position cues of pulse position inside the window, and the position cues are converted into the control signal temporally spread over the length of the window and comprising the indications of position, at the instants corresponding to the position cues.

10. The method according to claim 8, wherein the conversion of the position cue comprises:
- formulating, from a base clock signal having a frequency Fe, N elementary clock signals all having the same frequency Fe but mutually temporally shifted by 1/N*Fe;
- controlling, with the N elementary clock signals, N flip-flops successively receiving the groups of N bits; and
- summing outputs of the N flip-flops.

11. A device for generating an ultra wideband position-modulated pulse signal, the device comprising:
- a controllable pulse generator to generate pulses of the pulse signal which are contained in time windows; and
- a controller to position the pulse inside the window with a temporal precision equal to 1/N*Fe by generating a control signal for the pulse generator, the control signal including, for each pulse, an indication of pulse position in the corresponding window, the controller comprising
  - a processor to deliver, for each time window, at a delivery frequency Fe greater than the pulse repetition frequency, successive groups of N bits together defining a digital cue of pulse position inside the window, and
  - a converter to convert the digital position cue into the control signal temporally spread over the length of the window and including the indication of pulse position at an instant corresponding to the digital position cue.

12. The device according to claim 11, wherein the temporal precision is at least 100 picoseconds.

13. The device according to claim 11, wherein N is a power of 2the delivery frequency is 200 MHz and the temporal precision is 50 picoseconds.

14. The device according to claim 11, wherein the delivery frequency is a multiple of the pulse repetition frequency.

15. The device according to claim 11, wherein for each time window just one group of the groups of bits comprises a bit having a first logic value while all other bits of the one group and other groups have a second logic value, the bit having the first logic value defining an initial instant of the pulse.

16. The device according to claim 11, wherein several temporally shifted pulses are emitted inside a window, the successive groups of N bits together define the digital cues of pulse position inside the window, and the converter converts the digital position cues into the control signal temporally spread over the length of the window and including the indications of pulse position, at instants corresponding to the digital position cues.

17. The device according to claim 11, wherein the converter comprises:
- a programmable clock circuit receiving a base clock signal having the frequency Fe and delivering N elementary clock signals all having the same frequency Fe but mutually temporally shifted by 1/N*Fe;
- N flip-flops connected at input to an output of the processor and respectively controlled by the N elementary clock signals, and respectively delivering N output signals; and
- a summator with N inputs respectively connected to outputs of the N flip-flops and providing the control signal.

18. The device according to claim 11, wherein the summator comprises N MOS transistors with bases respectively linked to the respective outputs of the N flip-flops.

19. The device according to claim 11, wherein the programmable clock circuit comprises a digital phase-locked loop including:
- a programmable ring oscillator delivering the N elementary clock signals,
- N second flip-flops all receiving the base clock signal and respectively controlled by the N elementary clock signals; and
- a control circuit receiving the respective outputs of the N second flip-flops and controlling the programmable ring oscillator.

20. The device according to claim 11, wherein the converter is defined by a CMOS integrated circuit.

21. A device for generating an ultra wideband position-modulated pulse signal, the device comprising:
- a controllable pulse generator to generate pulses of the pulse signal which are contained in time windows; and
- a control means for positioning the pulse inside the window with a temporal precision equal to 1/N*Fe by generating a control signal for the pulse generator, the control signal including, for each pulse, an indication of pulse position in the corresponding window, the control means comprising
  - processing means for delivering, for each time window, at a delivery frequency Fe greater than the pulse repetition frequency, successive groups of N bits together defining a digital cue of pulse position inside the window, and conversion means for converting the digital position cue into the control signal temporally spread over the length of the window and including the indication of pulse position at an instant corresponding to the digital position cue.

22. The device according to claim 21, wherein the temporal precision is at least 100 picoseconds.

23. The device according to claim 21, wherein N is a power of 2, the delivery frequency is 200 MHz and the temporal precision is 50 picoseconds.

24. The device according to claim 21, wherein the delivery frequency is a multiple of the pulse repetition frequency.

25. The device according to claim 21, wherein for each time window just one group of the groups of bits comprises a bit having a first logic value while all other bits of the one group and other groups have a second logic value, the bit having the first logic value defining an initial instant of the pulse.

26. The device according to claim 21, wherein several temporally shifted pulses are emitted inside a window, the successive groups of N bits together define the digital cues of pulse position inside the window, and the conversion means converts the digital position cues into the control signal temporally spread over the length of the window and including the indications of pulse position, at instants corresponding to the digital position cues.

27. The device according to claim 21, wherein the conversion means comprises:

a programmable clock circuit receiving a base clock signal having the frequency Fe and delivering N elementary clock signals all having the same frequency Fe but mutually temporally shifted by 1/N*Fe;

N flip-flops connected at input to an output of the processor and respectively controlled by the N elementary clock signals, and respectively delivering N output signals; and a summator with N inputs respectively connected to outputs of the N flip-flops and providing the control signal.

28. The device according to claim 27, wherein the summator comprises N MOS transistors with bases respectively linked to the respective outputs of the N flip-flops.

29. The device according to claim 27, wherein the programmable clock circuit comprises a digital phase-locked loop including:

a programmable ring oscillator delivering the N elementary clock signals,

N second flip-flops all receiving the base clock signal and respectively controlled by the N elemsntary clock signals; and a control circuit receiving the respective outputs of the N second flip-flops and controlling the programmable ring oscillator.

30. The device according to claim 21, wherein the converter is defined by a CMOS integrated circuit.

31. A device for generating an ultra wideband position-modulated pulse signal, the device comprising:

a controllable pulse generator to generate pulses of the pulse signal which are contained in time windows; and a controller to generate a control signal for the pulse generator, the control signal including, for each pulse, an indication of pulse position in the corresponding window, the controller comprising a processor to deliver, for each time window, groups of bits together defining a position cue of pulse position inside the window, and a converter to convert the position cue into the control signal temporally spread over the length of the window and including the indication of pulse position corresponding to the digital position cue.

32. The device according to claim 31, wherein the converter comprises:

a programmable clock circuit receiving a base clock signal having a frequency Fe and delivering N elementary clock signals all having the same frequency Fe but mutually temporally shifted by 1/N*Fe;

N flip-flops connected at input to an output of the processor and respectively controlled by the N elementary clock signals, and respectively delivering N output signals, and a summator with N inputs respectively connected to outputs ot the N flip-flops and providing the control signal.

33. A terminal of a wireless local area network transmission system, comprising a device according to claim 31.

* * * * *

UNITED STATES PATENT AND TRADEMARK OFFICE
CERTIFICATE OF CORRECTION

PATENT NO. : 7,289,561 B2
APPLICATION NO. : 10/465532
DATED : October 30, 2007
INVENTOR(S) : Helal et al.

It is certified that error appears in the above-identified patent and that said Letters Patent is hereby corrected as shown below:

| | |
|---|---|
| Cover page item (30) | Insert: -- Foreign Application Priority Data<br>June 26, 2002   EP   ................ 02291594.6 -- |
| Column 1, Line 32 | Delete: "UWS"<br>Insert: -- UWB -- |
| Column 1, Line 40 | Delete: "na"<br>Insert: -- ns -- |
| Column 2, Line 15 | Delete: "cosition"<br>Insert: -- position -- |
| Column 6, Line 45 | Delete: "bite"<br>Insert: -- bits -- |
| Column 7, Line 29 | Delete: "pulses"<br>Insert: -- pulse -- |
| Column 8, Line 7 | Delete: "2the"<br>Insert: -- 2, the -- |
| Column 8, Line 39 | Delete: "11"<br>Insert: -- 17 -- |
| Column 8, Line 44 | Delete: "ioop"<br>Insert: -- loop -- |

UNITED STATES PATENT AND TRADEMARK OFFICE
CERTIFICATE OF CORRECTION

PATENT NO. : 7,289,561 B2
APPLICATION NO. : 10/465532
DATED : October 30, 2007
INVENTOR(S) : Helal et al.

It is certified that error appears in the above-identified patent and that said Letters Patent is hereby corrected as shown below:

Column 10, Line 1   Delete: "27"
                    Insert: -- 21 --

Signed and Sealed this

Second Day of September, 2008

JON W. DUDAS
*Director of the United States Patent and Trademark Office*